United States Patent
Eshel

(10) Patent No.: US 7,558,108 B2
(45) Date of Patent: Jul. 7, 2009

(54) 3-BIT NROM FLASH AND METHOD OF OPERATING SAME

(75) Inventor: Noam Eshel, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 117 days.

(21) Appl. No.: 11/265,767

(22) Filed: Nov. 1, 2005

(65) Prior Publication Data

US 2006/0092684 A1    May 4, 2006

Related U.S. Application Data

(60) Provisional application No. 60/624,744, filed on Nov. 2, 2004.

(51) Int. Cl.
*G11C 11/34* (2006.01)

(52) U.S. Cl. .................. 365/185.03; 365/185.24; 365/185.28

(58) Field of Classification Search ............ 257/314; 365/185.03, 185.18, 185.24, 185.28, 104
See application file for complete search history.

(56) References Cited

U.S. PATENT DOCUMENTS

| | | | | |
|---|---|---|---|---|
| 5,768,192 A | * | 6/1998 | Eitan | 365/185.24 |
| 6,233,175 B1 | * | 5/2001 | Wang et al. | 365/185.03 |
| 6,313,501 B1 | * | 11/2001 | Kwon | 257/317 |
| 6,735,124 B1 | * | 5/2004 | Melik-Martirosian et al. | 365/185.28 |
| 6,847,550 B2 | * | 1/2005 | Park | 365/185.03 |
| 6,897,533 B1 | * | 5/2005 | Yang et al. | 257/369 |
| 6,937,511 B2 | * | 8/2005 | Hsu et al. | 365/185.03 |
| 6,949,788 B2 | * | 9/2005 | Fujiwara et al. | 257/314 |
| 7,180,780 B1 | * | 2/2007 | Ho et al. | 365/185.18 |
| 2007/0030756 A1 | * | 2/2007 | Park et al. | 365/238.5 |

* cited by examiner

*Primary Examiner*—VanThu Nguyen
*Assistant Examiner*—Alexander Sofocleous
(74) *Attorney, Agent, or Firm*—Bever, Hoffman & Harms, LLP; E. Eric Hoffman

(57) ABSTRACT

Operation of conventional nitride read-only-memory (NROM) cells is modified, such that each charge trapping region of an NROM cell is capable of storing any one of three charge states. For example, each charge trapping region can have an erased state, a first programmed state, or a second programmed state. Each of these states results in a different threshold voltage. During a read operation, the threshold voltages associated with two charge trapping regions are identified and decoded to provide a 3-bit data value. If each NROM cell includes two separate charge trapping regions, two NROM cells can store a total of 6-bits of data. The average storage density is therefore increased from two bits per NROM cell to three bits per NROM cell.

7 Claims, 6 Drawing Sheets

3-BIT NROM FLASH AND METHOD OF OPERATING SAME

RELATED APPLICATIONS

This application claims priority of U.S. Provisional Patent Application 60/624,744, entitled "3 Bit NROM Flash" filed Nov. 2, 2004.

FIELD OF THE INVENTION

The present invention relates to non-volatile memory arrays, and in particular, nitride read-only-memory (NROM) cell arrays, and methods of increasing storage density in such arrays.

BACKGROUND OF THE INVENTION

Non-volatile memory (NVM) systems make use of an array of NVM cells. An NVM cell is typically an n-channel MOS transistor with an adjustable threshold voltage ($V_T$). There are several known families of NVM cells and several known methods for adjusting the threshold voltages of such NVM cells for either programming or erasing. Such methods include hot carrier injection or tunneling of charge into a 'storage' layer or floating gate in the NVM transistor.

The density of NVM cell arrays is one of the key factors in determining the cost of NVM chips. Many circuit and process design steps have been suggested to increase the density of the bits of data in a given NVM array area, including the NAND array architecture (Toshiba, Samsung, San-Disk) and the AND array architecture (Hitachi).

In 1997, Intel introduced the "Strata-Flash" NVM cell, which exhibits double the density of conventional NVM cells. Each Strata-Flash NVM cell is capable of storing two logic data bits. To accomplish this, the threshold voltage of a Strata-Flash NVM cell is adjusted to have any one of four states. These four states are defined as: (1) erased, (2) weakly programmed, (3) moderately programmed, and (4) strongly programmed.

FIG. 1 is a graph 100 illustrating a threshold voltage distribution for one or more Strata-Flash NVM cells. The erased, weakly programmed, moderately programmed and strongly programmed states are represented by curves 101, 102, 103 and 104, respectively. Thus, an erased Strata-Flash NVM cell exhibits a threshold voltage in the range of about 1.5 Volts to about 3 Volts; a weakly programmed Strata-Flash NVM cell exhibits a threshold voltage in the range of about 3.5 Volts to about 3.9 Volts; a moderately programmed Strata-Flash NVM cell exhibits a threshold voltage of in the range of about 4.4 Volts to about 4.75 Volts; and a strongly programmed Strata-Flash NVM cell exhibits a threshold voltage in the range of about 5.6 Volts to about 6.2 Volts.

To read a Strata-Flash NVM cell, the state of the threshold voltage $V_T$ of the cell is determined. The result is then decoded to provide a 2-bit read data value. For example, as illustrated in FIG. 1, the erased, weakly programmed, moderately programmed and strongly programmed states correspond with 2-bit binary data values of "11", "10", "01" and "00", respectively.

The Strata-Flash NVM cell requires precise programming of the threshold voltage, such that complex programming circuitry must be provided. In addition, the read circuitry, which must detect four threshold voltage ranges, is also relatively complex. Moreover, even slight drifting of the programmed threshold voltage (e.g., ½ Volt or less) can result in errors.

A completely different type of NVM cell, which is also capable of storing 2-bit binary data values, is the nitride read-only-memory (NROM) cell provided by Saifun Semiconductors, Ltd.

FIG. 2 is a cross sectional view of a conventional NROM cell 200, which includes p-type region 201, N+source/drain (and diffusion bit line) regions 211-212, oxide-nitride-oxide (ONO) structure 220, bit line oxide regions 231-232 and polysilicon control gate (and word line) 240. ONO structure 220 includes lower oxide layer 221, nitride layer 222 and upper oxide layer 223. NROM cell 200 stores two data bits in two separate charge trapping regions 222L and 222R in nitride layer 222.

Charge trapping region 222R of memory cell 200 is programmed by connecting source region 211 to ground, drain region 212 to a programming voltage of about 5 Volts, and control gate 240 to a voltage of about 10 Volts. Under these conditions, electrons are accelerated from source region 211 to drain region 212. Near drain region 212, some electrons gain sufficient energy to pass through oxide layer 221 and be trapped in charge trapping region 222R (i.e., hot electron injection). Because nitride layer 222 is non-conductive, the injected charge remains localized within charge trapping region 222R.

The bit stored in charge trapping region 222R is read by applying 0 Volts to drain region 212, 2 Volts to source region 211, and 3 Volts to control gate 240. Under these conditions, the current conducted by memory cell 200 is dependent on the amount of charge stored in charge trapping region 222R. The current, or lack of current, is sensed by a sense amplifier to determine the state of one bit stored by memory cell 200. Because the read operation is performed in the opposite direction of the program operation, the read operation is referred to as a reverse read operation.

FIG. 3A is a graph 300 that plots the threshold voltages of programmed and erased states of NROM cell 200 for various bit line voltages. FIG. 3B is a graph 301 illustrating threshold voltage distribution for one or more NROM cells identical to NROM cell 200.

Charge trapping region 222L of memory cell 200 is programmed and read in a manner similar to charge trapping region 222R. More specifically, charge trapping region 222L is programmed and read by exchanging the source and drain voltages described above for programming and reading charge trapping region 222R. The state of charge trapping region 222R does not interfere with the reading (or programming) of the state of charge trapping region 222L (and vice versa). NROM cell 200 is described in more detail in U.S. Pat. No. 5,768,192, to Eitan.

Although NROM cell 200 is capable of storing 2-bits of data, it would be desirable to have a NROM cell capable of storing more than 2-bits of data. In order to further increase the density of NROM cell arrays in a given fabrication process, a new architecture is required.

It would further be desirable if such a NROM cell could be laid out in an area-efficient manner, such that the memory density (bits per area) can be increased with respect to a conventional 2-bit NROM cell. It would further be desirable if such an NROM cell could be fabricated using a conventional process.

SUMMARY OF THE INVENTION

Accordingly, the present invention provides an NROM array that exhibits an increased density, without exceeding the physical limitations of a conventional NROM cell. In one embodiment, the present invention increases the storage capacity of an NROM array by 50%. As described above (FIG. 2), a conventional NROM cell stores two data bits, one in each of two physically separate nodes of the NROM cell. The present invention modifies the operation of the NROM cell, such that the NROM cell stores three threshold voltage ($V_T$) states in each storage node of the NROM cell. That is, each storage node of the NROM cell can be in an erased state, a moderately programmed state, or a fully programmed state.

In accordance with one embodiment, NROM cells are logically grouped in pairs. A data value is read from a pair of NROM cells in the following manner. A first charge trapping regions in a first NROM cell and a first charge trapping region in a second NROM cell are subject to a read operation, wherein the threshold voltage states associated with these charge trapping regions are determined. Because each charge trapping region has three possible states, reading the first and second NROM cells can provide nine possible combinations (3*3=9). Eight of these nine combinations are decoded into three binary bits. In this manner, a pair of charge trapping regions in the first and second NROM cells provide 3-bits of data. Because each NROM cell includes two separate charge trapping regions, two NROM cells can store a total of 6-bits of data (2*3=6). Consequently, the average storage density is therefore increased from two bits per NROM cell to three bits per NROM cell.

The present invention will be more fully understood in view of the following description and drawings.

DETAILED DESCRIPTION OF THE INVENTION

Figure 1:
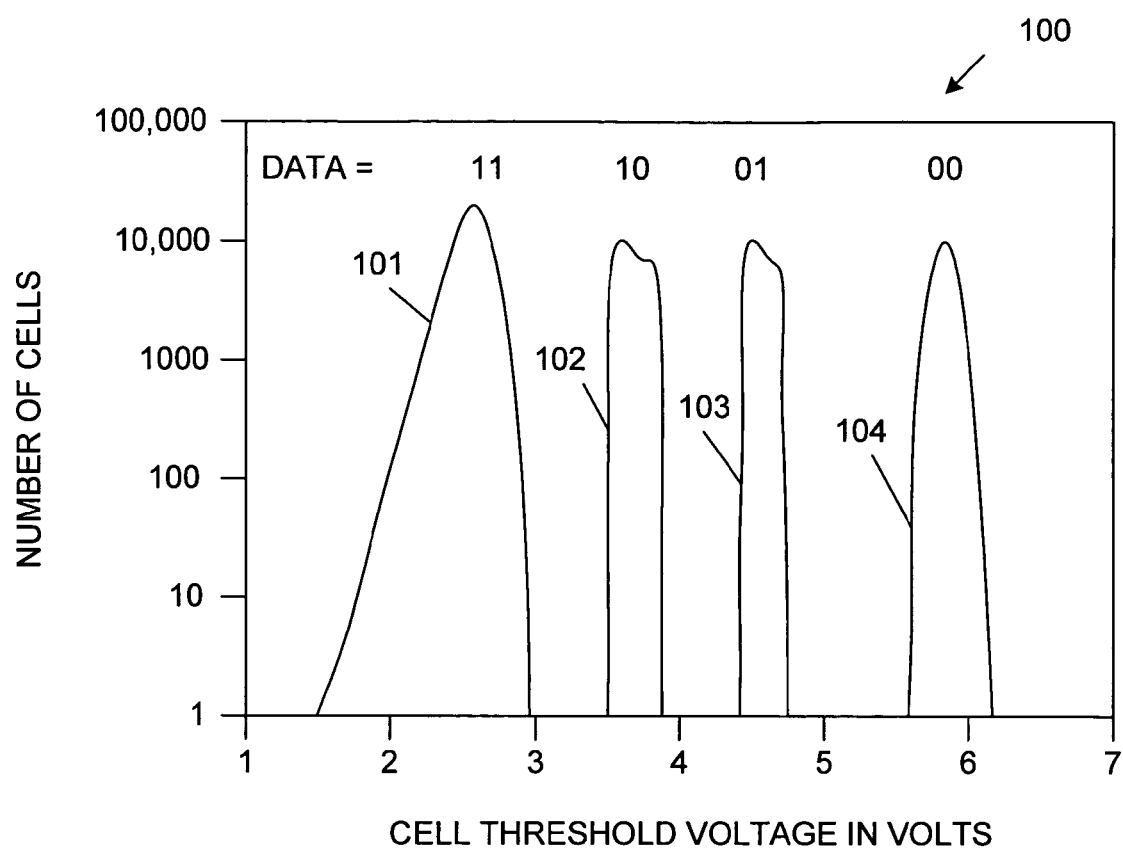
FIG. 1 is a graph 100 illustrating a threshold voltage distribution for one or more conventional Strata-Flash NVM cells.
Figure 2:
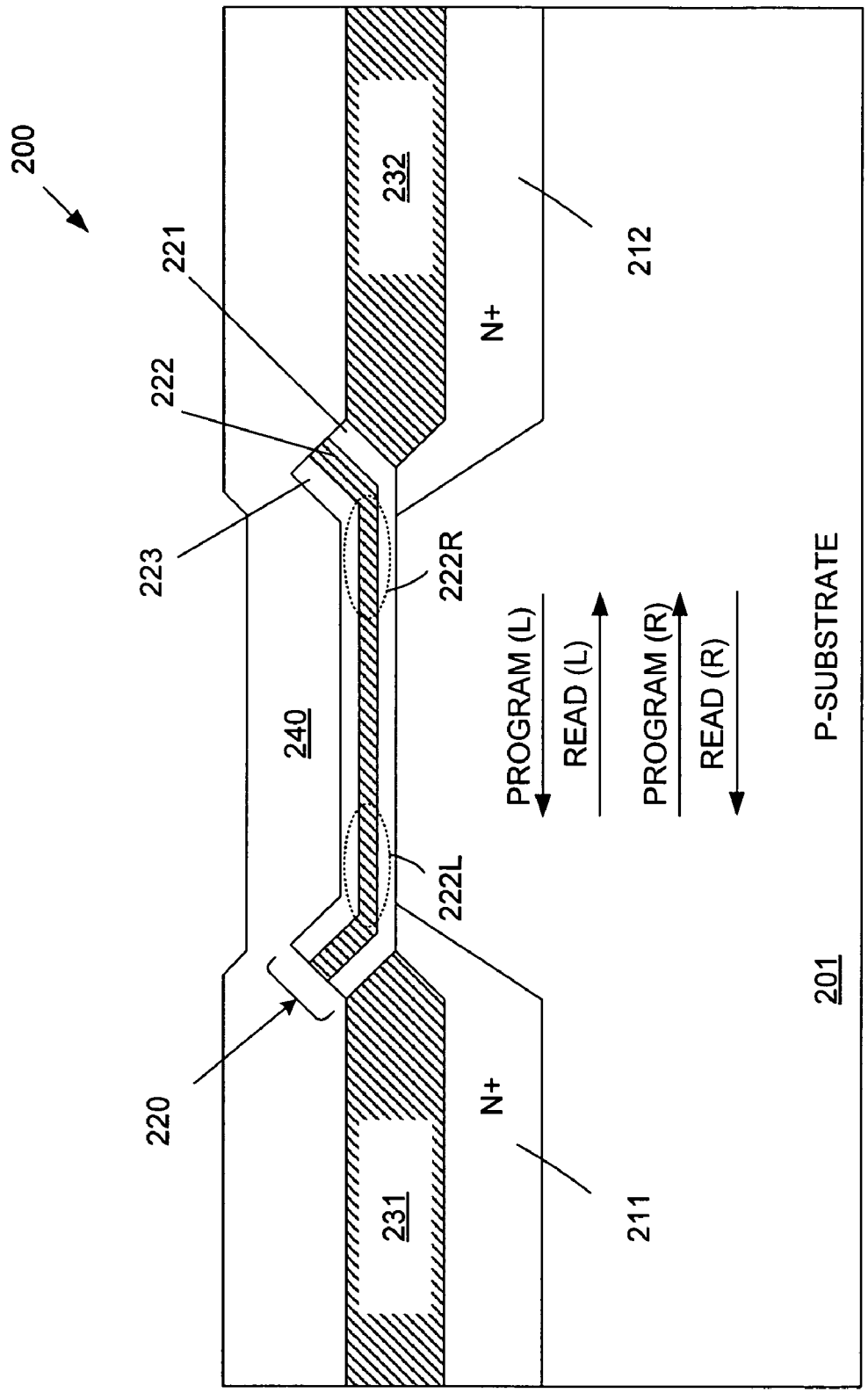
FIG. 2 is a cross sectional view of a conventional 2-bit NROM NVM cell.
Figure 3A:
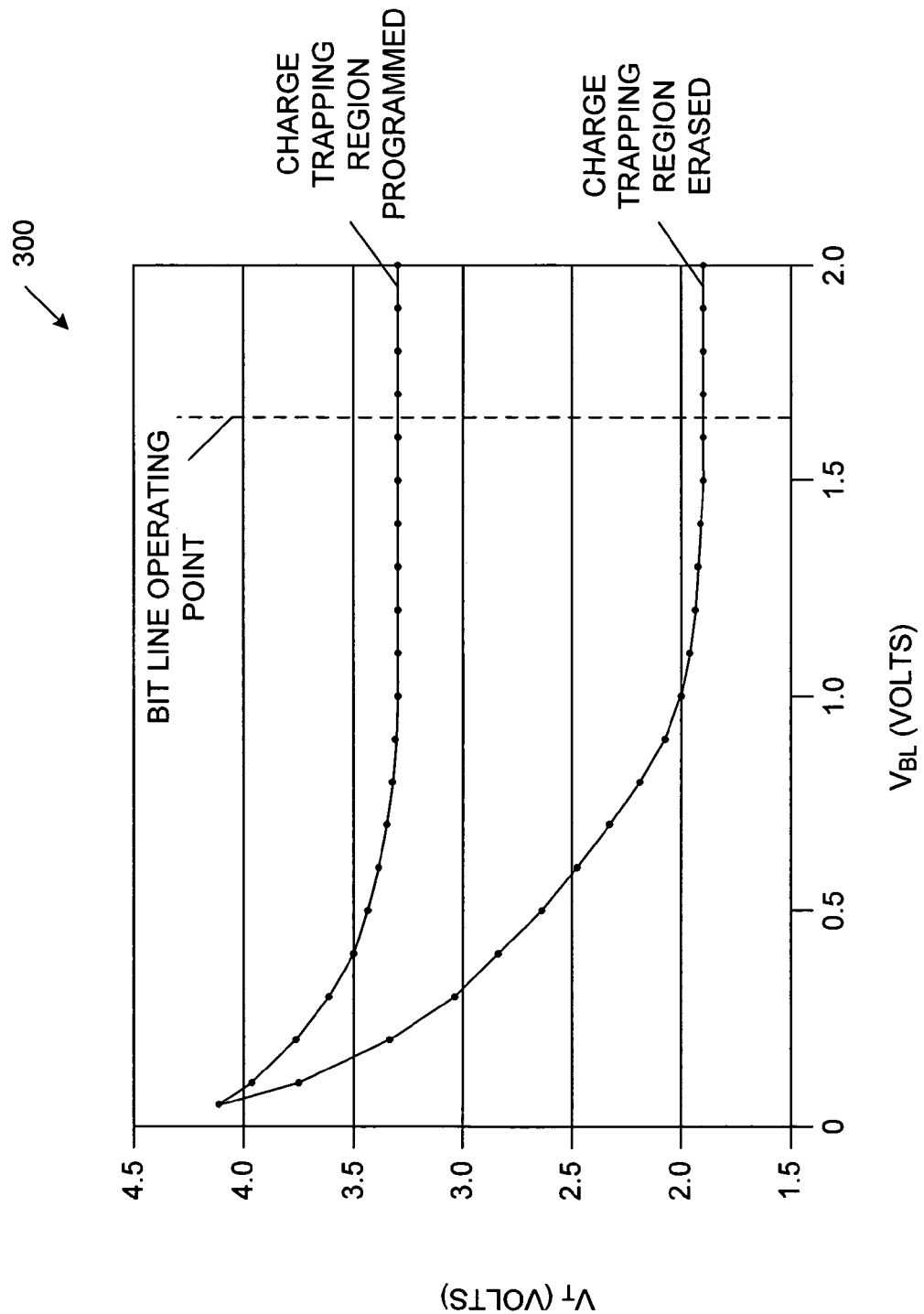
FIG. 3A is a graph that illustrates the threshold voltages of a programmed NROM cell and an erased NROM cell at various bit line voltages.
Figure 3B:
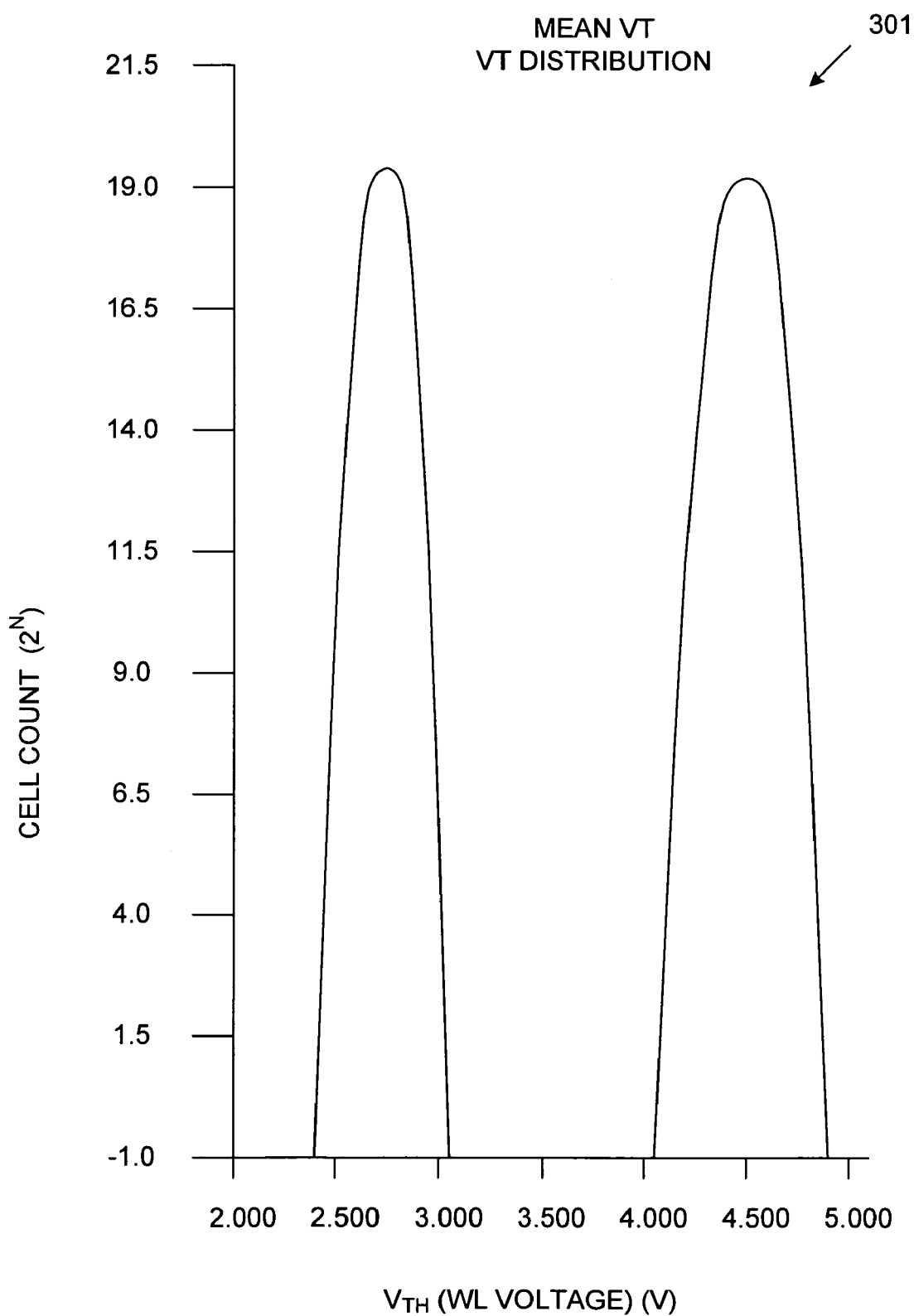
FIG. 3B is a graph illustrating the distribution of typical threshold voltages of programmed and erased bits in the NROM cell of FIG. 2.
Figure 4:
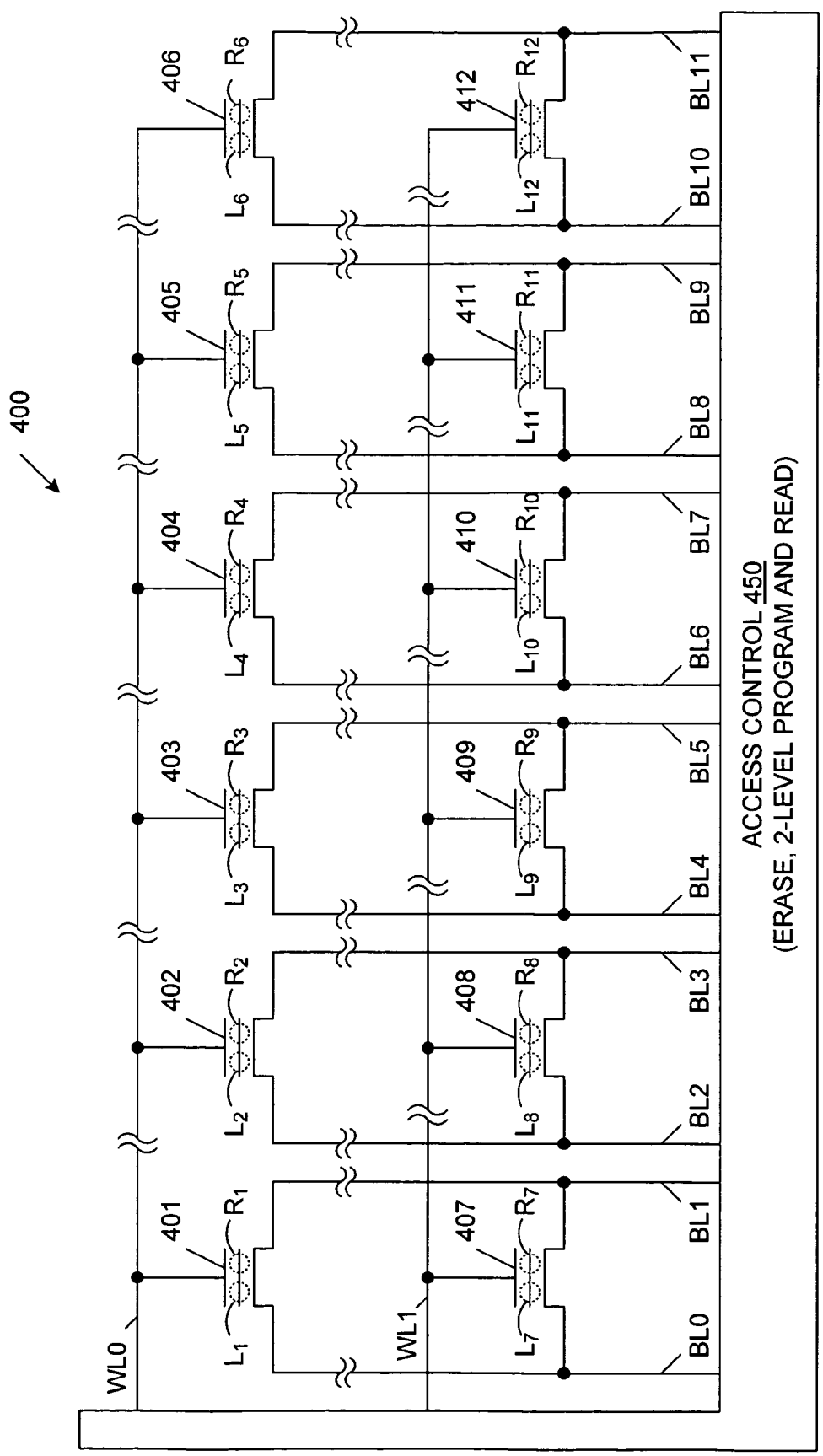
FIG. 4 is a circuit diagram of an NROM array in accordance with one embodiment of the present invention.

FIG. 4 is a circuit diagram of an NROM array 400 in accordance with one embodiment of the present invention. NROM array 400 includes a plurality of NROM cells 401-412, arranged in rows and columns, and an access control circuit 450. In one embodiment, each of NROM cells 401-412 is similar to NROM cell 200 (FIG. 2). Thus, each of NROM cells 401-412 includes a pair of isolated charge trapping regions (i.e., a right charge trapping region and a left charge trapping region), each located over a corresponding source/drain region of the associated NROM cell. NROM cells 401-412 include left charge trapping regions $L_1$-$L_{12}$, respectively, and right charge trapping regions $R_1$-$R_{12}$, respectively. Each charge trapping region is illustrated as a dashed circle in FIG. 1. The control gates of NROM cells 401-406 of the first row are coupled to word line WL0, while the control gates of NROM cells 407-412 of the second row are coupled to word line WL1. Each column of NROM cells is coupled to a common bit line pair. For example, NROM cells 401 and 407 of the first column are coupled to bit line pair BL0-BL1. It is understood that NROM array 400 can be constructed to have various sizes and configurations, which would be apparent to one of ordinary skill in the art.

As described in more detail below, the six illustrated NROM cells 401-406 of the first row are used to store eighteen bits of data. More specifically, right charge trapping regions $R_1$-$R_6$ store one 9-bit data word, and left charge trapping regions $L_1$-$L_6$ store another 9-bit data word. As will become apparent in view of the disclosure provided below, this is accomplished by providing each of charge trapping regions $L_1$-$L_6$ and $R_1$-$R_6$ with three possible charge levels. Because six NROM cells are capable of storing eighteen data bits, each of the NROM cells in array 400 is effectively capable of storing 3-bits of data. This is improves the conventional storage capacity of an NROM cell from 2-bits/cell to 3 bits/cell (i.e., a 50 percent increase in storage).

Each of the charge trapping regions $L_1$-$L_{12}$ and $R_1$-$R_{12}$ of NROM cells 401-412 can be controlled to store one of three predetermined charge levels, $C_0$, $C_1$, and $C_2$. One of these predetermined charge levels ($C_0$) corresponds with a conventional erased state, and another one of these predetermined charge levels ($C_2$) corresponds with a conventional programmed state (hereinafter referred to as a fully programmed state). The remaining one of these predetermined charge levels ($C_1$) is an intermediate charge level that exists between the erased state and the fully programmed state. That is, $C_2 > C_1 > C_0$. The intermediate charge level ($C_1$) identifies a programmed state that is hereinafter referred to as a moderately programmed state.

Each of the three predetermined charge levels $C_0$, $C_1$ and $C_2$ causes the associated charge trapping region to exhibit a different corresponding threshold voltage. Because each NROM cell is capable of storing charge in two separate charge trapping regions, each NROM cell is capable of exhibiting two different threshold voltages, one for each directional read operation. The threshold voltage associated with each charge trapping region of NROM cells 401-412 can be identified as threshold voltage $V_{XY}$, where the variable "X" is either "L" or "R" to identify the left or right charge trapping region, respectively, and the variable "Y" corresponds with the last two digits of the NROM cell. For example, the threshold voltage associated with the right charge trapping region of NROM cell 405 is identified as $V_{R05}$.

Figure 5:
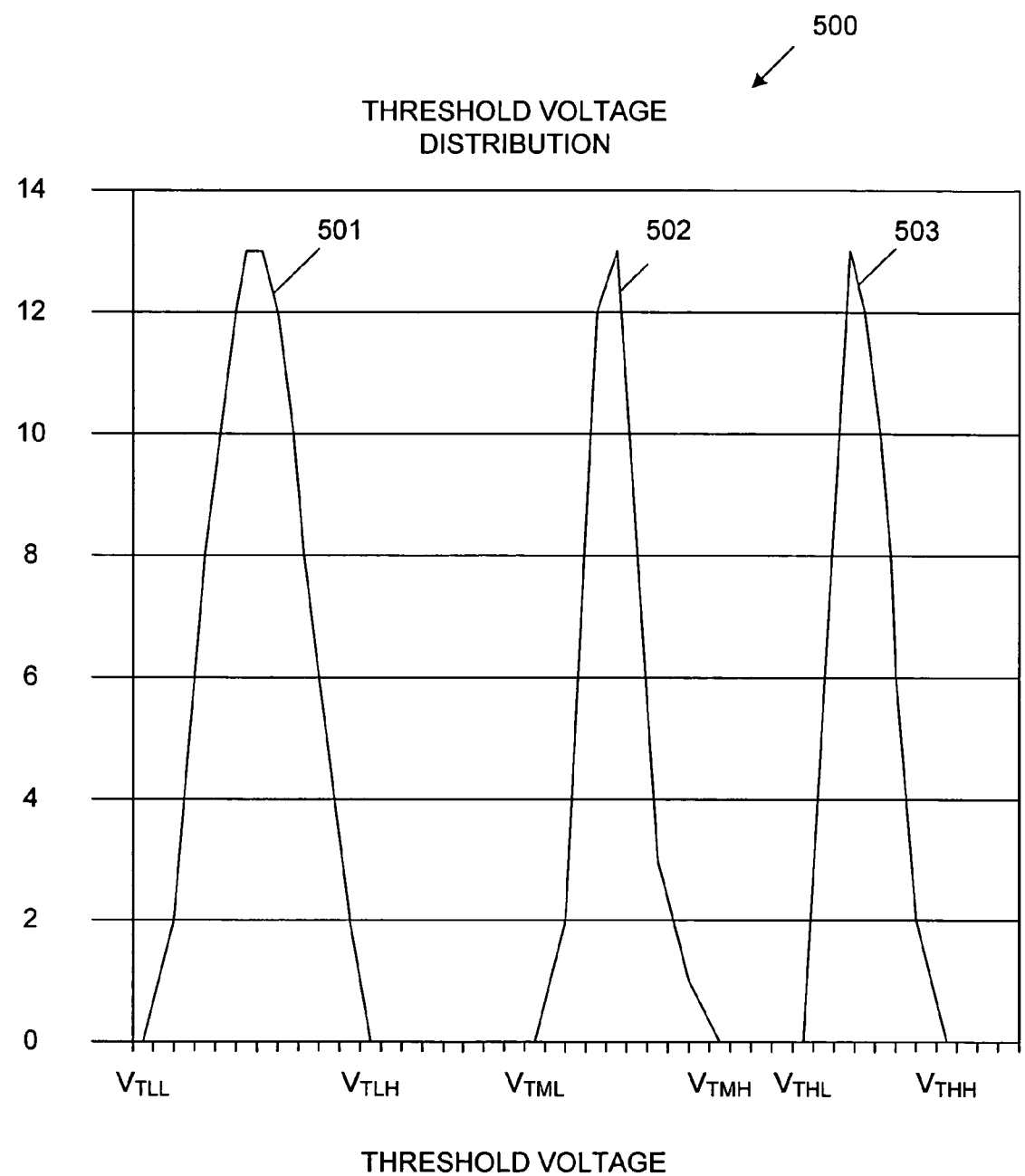
FIG. 5 is a graph illustrating the threshold voltage distribution of one or more NROM cells that exhibit three separate threshold voltage levels, in accordance with one embodiment of the present invention.

FIG. 5 is a graph 500 illustrating the threshold voltage distribution of one or more NROM cells having charge trapping regions that exhibit the erased state 501 (i.e., charge level $C_0$), charge trapping regions that exhibit the moderately programmed state 502 (i.e., charge level $C_1$), and charge trapping regions that exhibit the fully programmed state 503 (i.e., charge level $C_2$), in accordance with one embodiment of the present invention.

NROM cells in the erased state (corresponding with distribution line 501) exhibit a threshold voltage that varies from $V_{TLL}$ to $V_{TLH}$. In one embodiment, $V_{TLL}$ is equal to about 2.2 Volts and $V_{TLH}$ is equal to about 2.8 Volts.

NROM cells in the moderately programmed state (corresponding with distribution line 502) exhibit a threshold voltage that varies from $V_{TML}$ to $V_{TMH}$. In one embodiment, $V_{TML}$ is equal to about 3.4 Volts and $V_{TMH}$ is equal to about 4 Volts.

NROM cells in the strongly programmed state (corresponding with distribution line 503) exhibit a threshold voltage that varies from $V_{THL}$ to $V_{THH}$. In one embodiment, $V_{THL}$ is equal to about 4.3 Volts and $V_{THH}$ is equal to about 4.7 Volts.

The erase, moderate programming and full programming operations will now be described in more detail.

The NROM cells 401-412 of NROM array 400 are erased in one or more blocks in accordance with one embodiment of the present invention. For example, NROM cells 401-412 can be simultaneously erased in the following manner. An erase control voltage of 0 to −10 Volts is applied to word lines WL0 and WL1, and an erase control voltage of 10 to 0 Volts is applied to bit lines BL0 to BL11. The erase control voltages are selected such that band-to-band tunneling of electrons will occur in each of the source/drain regions of NROM cells 401-412. The created holes are accelerated in the lateral electric field and injected into the left and right charge trapping regions $L_1$-$L_{12}$ and $R_1$-$R_{12}$ of NROM cells 401-412. These injected holes recombine with any electrons stored in the charge trapping regions $L_1$-$L_{12}$ and $R_1$-$R_{12}$, such that these charge trapping regions exhibit the predetermined charge level $C_0$. In the erased state, each of NROM cells 401-412 exhibits a relatively low threshold voltage, in the range of $V_{TLL}$ to $V_{TLH}$.

After the erase operation has been completed, selected charge trapping regions in NROM cells 401-412 can be subjected to a moderate programming operation or a full programming operation. The left and right charge-trapping regions of each NROM cell are programmed independently.

In accordance with one embodiment, selected charge trapping regions in NROM cells 401-412 of NROM array 400 can be fully programmed in the following manner. A charge trapping region is programmed by holding the bit line opposite the charge trapping region at the ground supply voltage. The bit line adjacent to the charge trapping region to be programmed is held at a programming voltage of about 3 to 7 Volts. The word line coupled to the NROM cell being programmed is held at a programming voltage of about 5 to 15 Volts. For example, the right charge trapping region $R_1$ of NROM cell 401 is programmed by holding bit line BL0 at ground, bit line BL1 at a programming voltage of about 3 to 7 Volts, and word line WL0 at a programming voltage of about 5 to 15 Volts.

Under these conditions, the predetermined charge $C_2$ is stored in the selected charge trapping region by hot electron injection. Note that programming is typically performed on a per word or per byte basis. Thus, the right charge trapping regions $R_1$-$R_6$ of NROM cells 401-406 can be simultaneously fully programmed. Similarly, the left charge trapping regions $L_1$-$L_6$ of NROM cells 401-406 can be simultaneously programmed during another programming operation. To prevent the programming of a charge trapping region when the word line of the associated NROM cell is held at the programming voltage of 5 to 15 Volts, the bit lines of this associated NROM cell are maintained at a voltage of 0 Volts. For example, holding bit lines BL2 and BL3 at 0 Volts during the programming of right charge trapping region $R_1$ will prevent right charge trapping region $R_2$ from being programmed.

Charge trapping regions in non-selected rows avoid programming by applying a low (e.g., ground) voltage to the word lines of these non-selected rows.

Each fully programmed charge trapping region will cause the associated NROM cell to exhibit a relatively high threshold voltage, in the range of $V_{THL}$ to $V_{THH}$, during a read operation directed at the fully programmed charge trapping region.

In accordance with one embodiment, selected charge trapping regions in NROM cells 401-412 can be moderately programmed in a manner similar to the above-described full programming operation. In this embodiment, the moderate programming operation is identical to the full programming operation, except that the duration of the moderate programming operation is controlled to be shorter than the duration of the full programming operation. The duration of the moderate programming operation is selected such that the predetermined charge $C_1$ is stored by the programmed charge trapping region at the end of the moderate programming operation.

The threshold voltage associated with a moderately programmed charge trapping region is significantly lower than the threshold voltage associated with a fully programmed charge trapping region. Each moderately programmed charge trapping region will cause the associated NROM cell to exhibit a medium threshold voltage, in the range of $V_{TML}$ to $V_{TMH}$, during a read operation directed at the moderately programmed charge trapping region.

In another embodiment of the present invention, the programming voltages applied to the selected word line and adjacent bit line during a moderate programming operation are reduced with respect to the programming voltages applied to the selected word line and the adjacent bit line during a full programming operation.

In yet another embodiment, access control circuit 450 includes control circuitry configured to monitor the current and/or voltage on bit lines BL0-BL11 during a moderate programming operation. Access control circuit 450 stops the moderate programming operation upon detecting that a predetermined current and/or voltage condition exists on bit lines BL0-BL11.

In still another embodiment, access control circuit 450 implements a two phase programming operation which performs both moderate programming and full programming. In the first phase of the programming operation, all of the charge trapping regions that should be either moderately programmed or fully programmed are simultaneously programmed to the intermediate charge level $C_1$. During the second phase of the programming operation, the charge trapping regions that should be moderately programmed are prevented from receiving additional charge (e.g., the associated bit lines are coupled to ground by access control circuit 450). However, the charge trapping regions that should be fully programmed continue to receive the programming control voltages until these charge trapping regions are fully programmed to charge level $C_2$. This method ensures that the fully programmed charge trapping regions will exhibit a higher threshold voltage than moderately programmed charge trapping regions.

The charge trapping regions of NROM cells 401-412 are read as follows in accordance with one embodiment of the present invention.

A charge trapping region is read by applying a read voltage of about 1.5 to 5 Volts to the word line of the associated NROM cell. The bit line opposite the charge trapping region is held at a read voltage of 0.5 to 2 Volts, and the bit line adjacent to the charge trapping region is coupled to a sense amplifier within access control circuit 450 (and held at a voltage of about 0 Volts), such that a reverse read condition exists for the charge trapping region. The read current flowing during this reverse read condition is dependent on the charge stored in the charge trapping region.

For example, the left charge trapping region $L_3$ of NROM cell 403 is read by holding bit line BL5 at read voltage of about 0.5 to 2 Volts, coupling bit line BL4 to ground via a sense amplifier, an holding word line WL0 at a read voltage of about 1.5 to 5 Volts. Under these conditions, the read current flowing through NROM cell 403 will be determined by the amount of charge stored in left charge trapping region $L_3$. A relatively large read current will flow through NROM cell 403 if left charge trapping region $L_3$ stores the predetermined charge $C_0$ associated with the erased state. A relatively small read current will flow through NROM cell 403 if left charge trapping region $L_3$ stores the predetermined charge $C_2$ associated with the fully programmed state. An intermediate read current, between the above-described relatively large and relatively small read currents, will flow through NROM cell 403 if left charge trapping region $L_3$ stores the predetermined charge $C_1$ associated with the moderately programmed state. Sense amplifier circuitry within access control circuit 450 identifies one of these three states in response to the sensed read current (and/or read voltage).

Note that read operations are typically performed on a per word or per byte basis. Thus, the selected left charge trapping regions $L_1$-$L_6$ of NROM cells 401-406 can be simultaneously read. Similarly, the selected right charge trapping regions $R_1$-$R_6$ of NROM cells 401-406 can be simultaneously read. Charge trapping regions in non-selected rows are prevented from being read by applying a low (e.g., ground) voltage to the word lines of these non-selected rows.

Upon detecting the results of the read operation, access control circuit 450 performs a decoding function, wherein the information from two charge trapping regions is decoded to provide a 3-bit value. In the described embodiment, the information read from right charge trapping regions $R_1$ and $R_2$ is decoded to provide 3-bits of a 9-bit data byte; the information read from right charge trapping regions $R_3$ and $R_4$ is decoded to provide another 3-bits of the 9-bit data byte; and the information read from right charge trapping regions $R_5$ and $R_6$ is decoded to provide another 3-bits of the 9-bit data byte. In a similar manner, the information read from left charge trapping regions $L_1$-$L_6$ can be decoded to provide another 9-bit data byte.

Table 1 below illustrates one manner in which the information read from two charge trapping regions can be decoded to a 3-bit value ("ABC"). The following table is an example of how three threshold voltage ($V_T$) levels on two NROM cells ('cell 1' and 'cell 2') can represent three binary bits (A, B, C).

TABLE 1

Decoding/Encoding

| CELL 401 State of $R_1$ | | | CELL 402 State of $R_2$ | | | Decoded Bits | | |
|---|---|---|---|---|---|---|---|---|
| Erased | Moderate Program | Strong Program | Erased | Moderate Program | Strong Program | A | B | C |
| 1 | 0 | 0 | 1 | 0 | 0 | 0 | 0 | 0 |
| 1 | 0 | 0 | 0 | 1 | 0 | 0 | 0 | 1 |
| 1 | 0 | 0 | 0 | 0 | 1 | 0 | 1 | 0 |
| 0 | 1 | 0 | 1 | 0 | 0 | 0 | 1 | 1 |
| 0 | 1 | 0 | 0 | 1 | 0 | 1 | 0 | 0 |
| 0 | 1 | 0 | 0 | 0 | 1 | 1 | 0 | 1 |
| 0 | 0 | 1 | 1 | 0 | 0 | 1 | 1 | 0 |
| 0 | 0 | 1 | 0 | 1 | 0 | 1 | 1 | 1 |
| 0 | 0 | 1 | 0 | 0 | 1 | — | — | — |

Thus, if access control circuit 450 determines that right charge trapping regions $R_1$ and $R_2$ are strongly programmed and erased, respectively, then access control circuit 450 will provide a 3-bit read data value of "110". Because 3-bits of data are simultaneously decoded from two charge trapping regions of two separate NROM cells, each charge trapping region effectively exhibits a storage density of 1.5 bits.

As illustrated in Table 1, the three charge levels ($C_0$, $C_1$ and $C_2$) stored in two locations provide a total of nine decodable states. Eight of these nine decodable states are used to identify three binary bits. The remaining decodable state can be used for error correction or another purpose, such as choosing a logic implementation that minimizes propagation delay.

The present example reduces the number of NROM cells required to store two 9-bit bytes from nine cells to six cells. Thus, the required array size can be reduced by a factor of 1-6/9, or 1/3.

Although the present invention has been described in connection with a 9-bit byte, it is understood that other byte/word widths can be used in other embodiments. For example, a 64-bit data word can be implemented by grouping 43 NROM cells. In this embodiment, 42 NROM cells (21 NROM cell pairs) are decoded to provide 63-bits, and a conventional NROM cell with regular sensing is used to provide the $64^{th}$ bit. In this example, there are 43 bit line pairs, and the required array size can be reduced by a factor of 1-43/64, or 32.8%.

By using two programming levels (in addition to a single erase level), the density of an array of NROM flash cells is improved, without sacrificing reliability. In addition, the NROM array of the present invention can be implemented using conventional methods of fabricating an NROM cell.

Modifying the NROM cell to store four different threshold voltage levels (i.e., one level of erasing and three levels of programming) in order to further increase the density of the NROM array may be possible. However, it is difficult to implement three levels of programming and one level of erasing in the NROM cell due to different physical limitations of the cell which result in decreased cell reliability. These limitations are mainly due to the so-called charge retention and redistribution, which cause the threshold voltages of the NROM cell to shift with time, thereby hindering the reliable storage of data and reducing the number of available program/erase cycles. However, it may be possible to overcome these limitations as the device technology improves.

Although the invention has been described in connection with several embodiments, it is understood that this invention is not limited to the embodiments disclosed, but is capable of various modifications, which would be apparent to a person skilled in the art. Thus, the invention is limited only by the following claims.

I claim:

1. A method of operating an array of nitride read-only-memory (NROM) cells, comprising:
storing a first charge in a first charge trapping region of a first NROM cell;
selecting the first charge such that a threshold voltage associated with the first charge trapping region of the first NROM cell exhibits one of three predetermined threshold voltages;
storing a second charge in a second charge trapping region of the first NROM cell;
selecting the second charge such that a threshold voltage associated with the second charge trapping region of the second NROM cell exhibits one of three predetermined threshold voltages;
identifying the threshold voltage associated with the first charge trapping region of the first NROM cell;
identifying the threshold voltage associated with the first charge trapping region of the second NROM cell;
decoding the identified threshold voltages associated with the first charge trapping regions of the first and second NROM cells to create three bits of binary data;
storing a third charge in a second charge trapping region of the first NROM cell;
selecting the third charge such that a threshold voltage associated with the second charge trapping region of the first NROM cell exhibits one of three predetermined threshold voltages;

storing a fourth charge in a second charge trapping region of the second NROM cell;

selecting the fourth charge such that a threshold voltage associated with the second charge trapping region of the second NROM cell exhibits one of three predetermined threshold voltages;

identifying the threshold voltage associated with the second charge trapping region of the first NROM cell;

identifying the threshold voltage associated with the second charge trapping region of the second NROM cell; and decoding the identified threshold voltages associated with the second charge trapping regions of the first and second NROM cells to create three bits of binary data.

2. The method of claim 1, wherein the step of storing the first charge comprises:

performing an erase step such that a first threshold voltage is associated with the first charge trapping region of the first NROM cell;

performing a moderate programming operation such that a second threshold voltage is associated with the first charge trapping region of the first NROM cell; or performing a full programming operation such that a third threshold voltage is associated with the first charge trapping region of the first NROM cell, wherein the second threshold voltage exists between the first threshold voltage and the third threshold voltage.

3. The method of claim 2, wherein the step of storing the second charge comprises:

performing an erase step such that the first threshold voltage is associated with the first charge trapping region of the second NROM cell;

performing a moderate programming operation such that the second threshold voltage is associated with the first charge trapping region of the second NROM cell; or performing a full programming operation such that the third threshold voltage is associated with the first charge trapping region of the second NROM cell.

4. The method of claim 2, wherein:

the moderate programming operation results in storage of a first negative charge in the first charge trapping region of the first NROM cell; and the full programming operation results in storage of a second negative charge in the first charge trapping region of the first NROM cell, wherein the second negative charge is greater than the first negative charge.

5. The method of claim 4, wherein the erase step results in the removal of negative charge from the first charge trapping region of the first NROM cell.

6. The method of claim 1, wherein the steps of selecting and storing the first charge are performed independent of the steps of selecting and storing the second charge.

7. The method of claim 1, wherein the steps of identifying the threshold voltages of the first charge trapping regions of the first and second NROM cells are performed in parallel.

* * * * *